(12) United States Patent
Jang

(10) Patent No.: US 8,405,153 B2
(45) Date of Patent: Mar. 26, 2013

(54) SEMICONDUCTOR DEVICE

(75) Inventor: Sai-Hyung Jang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 704 days.

(21) Appl. No.: 12/488,615

(22) Filed: Jun. 22, 2009

(65) Prior Publication Data

US 2010/0237420 A1    Sep. 23, 2010

(30) Foreign Application Priority Data

Mar. 23, 2009  (KR) .................. 10-2009-0024392

(51) Int. Cl.
*H01L 21/70* (2006.01)
(52) U.S. Cl. ................... 257/368; 257/E29.021
(58) Field of Classification Search ............ 257/368, 257/E29.021
See application file for complete search history.

(56) References Cited

U.S. PATENT DOCUMENTS

| 5,267,208 | A | * | 11/1993 | Asano | .............. 365/189.12 |
| 6,683,364 | B2 | | 1/2004 | Oh et al. | |
| 2004/0145016 | A1 | | 7/2004 | Ueda | |
| 2008/0001213 | A1 | | 1/2008 | Zhu et al. | |

FOREIGN PATENT DOCUMENTS

| KR | 100463196 | 12/2004 |
| KR | 100628247 | 9/2006 |
| KR | 1020070089541 | 8/2007 |
| KR | 1020080084706 | 9/2008 |

OTHER PUBLICATIONS

Notice of Allowance issued by the Korean Intellectual Property Office on Aug. 7, 2012.

* cited by examiner

*Primary Examiner* — Stephen W Smoot
*Assistant Examiner* — Vicki B. Booker
(74) *Attorney, Agent, or Firm* — IP & T Group LLP

(57) ABSTRACT

A semiconductor device includes an active region formed in a substrate; an isolation structure formed to surround the active region; and one or more dummy regions formed between the active region and the isolation structure to extend integrally from the active region.

12 Claims, 10 Drawing Sheets

SEMICONDUCTOR DEVICE

CROSS-REFERENCE TO RELATED APPLICATIONS

The present invention claims priority of Korean patent application number 10-2009-0024392, filed on Mar. 23, 2009, the disclosure of which is incorporated herein by reference in its entirety.

BACKGROUND OF THE INVENTION

The present invention relates to the design of a semiconductor, and more particularly, to a semiconductor device which can reduce off-state leakage current due to reverse narrow width effect (RNWE) resulting from mechanical stress.

Recently, as portable information terminals are distributed, the demand for high capacity memory devices, which have small sizes and relatively superior power consumption characteristics, have been increased considerably. In order to meet the demand, it is essential to reduce semiconductor device size. However, as semiconductor devices become smaller, since leakage current proportionally increases, it has become more difficult to improve the performance of semiconductor devices.

In general, it has been known that, as size of transistors constituting a memory device becomes smaller, power consumption under an atmospheric condition increases. This results from the facts that, as the distance between a source and a drain decreases, a leakage current component flowing through a substrate between the source and drain increases and that a leakage current component generated at a zone between an active region and an isolation structure increases due to a shallow trench isolation (STI) process.

The leakage current flowing between the source and the drain is caused by narrow width effect (NWE) such as short channel effect (SCE), and the leakage current generated at the zone between the active region and the isolation structure due to the presence of defects such as divots is caused by reverse narrow width effect (RNWE). In addition, the leakage current caused by RNWE can be generated by mechanical stress from a material used to form the isolation structure when the STI process is adopted.

FIG. 1 is a plan view illustrating a conventional transistor so as to explain RNWE due to mechanical stress, and FIG. 2 is a cross-sectional view taken along the line I-I' of FIG. 1. In FIG. 1, the reference symbol W designates the width of the transistor, and the reference symbol Lg designates the length of a gate.

Referring to FIGS. 1 and 2, a conventional transistor includes a source 110 and a drain 112, which are formed in a quadrangular active region and spaced apart from each other by a predetermined distance, and a gate 108, which is formed in a bar type to traverse the area between the source 110 and the drain 112. Here, the gate 108 includes a gate dielectric layer 104 and a gate electrode 106.

In the conventional transistor, as miniaturization of the transistor progresses, the length Lg of the gate 108 decreases, and the width W of the transistor also decreases. In general, as the width W of the transistor decreases, the leakage current under an atmospheric condition (hereafter referred to as "off-state leakage current") decreases.

However, if an STI process is adopted, the off-state leakage current increases from a point of width W as shown in FIG. 3. It can be observed from FIG. 3 that the off-state leakage current increases through an RNWE range. One of the reasons why the off-state leakage current increases through a certain range of width W when the STI process is adopted is the mechanical stress of an isolation structure 105.

The isolation structure 105 includes a multi-layered insulation structure including an oxide layer 103 and a nitride layer 102. Accordingly, the mechanical stress that is induced by the respective layers 102 and 103 constituting the isolation structure 105, in particular, the nitride layer 102, exerts influences on the source 110 and the drain 112, which adjoin the isolation structure 105. Due to this fact, defects are likely to be produced in the source 110 and the drain 112, which adjoin the isolation structure 105. While a precise mechanism for these defects has not been found yet, the defects are produced in various forms and increase the off-state leakage current.

SUMMARY OF THE INVENTION

Embodiments of the present invention are directed to providing a semiconductor device that can reduce off-state leakage current due to reverse narrow width effect (RNWE) resulting from the mechanical stress by an isolation structure.

In accordance with an aspect of the present invention, there is provided a semiconductor device including an active region formed in a substrate; an isolation structure formed to surround the active region; and one or more dummy regions formed between the active region and the isolation structure to extend integrally from the active region.

DESCRIPTION OF SPECIFIC EMBODIMENTS

Figure 1:
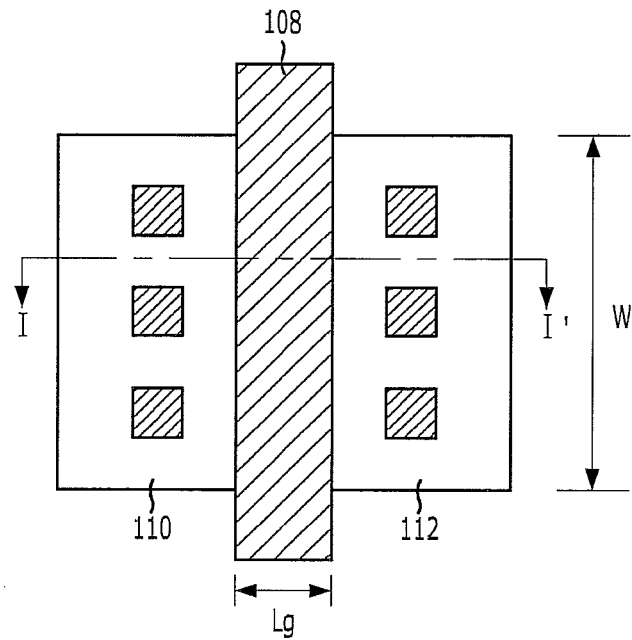
FIG. 1 is a plan view illustrating a conventional semiconductor device.
Figure 2:
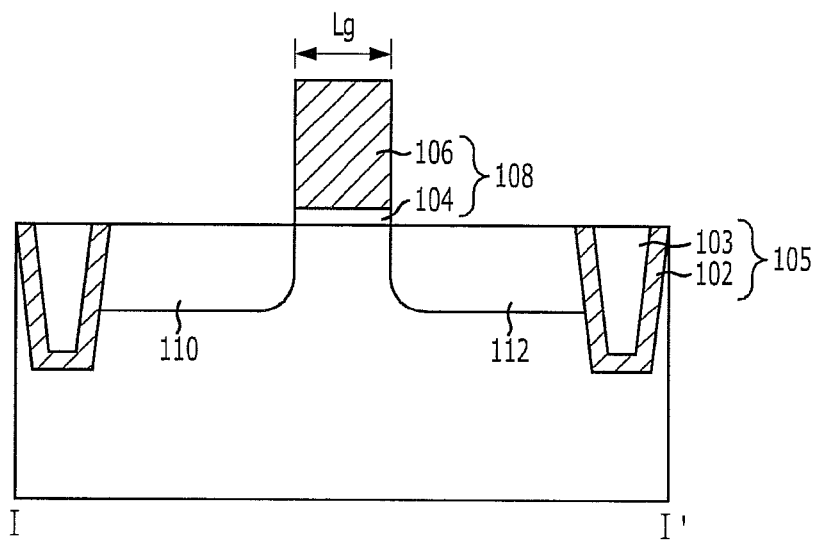
FIG. 2 is a cross-sectional view taken along the line I-I' of FIG. 1.

Other objects and advantages of the present invention can be understood by the following description, and become apparent with reference to the embodiments of the present invention.

Referring to the drawings, the illustrated thickness of layers and regions may be exemplary and may not be accurate. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, although they appear in different embodiments or drawings of the present invention.

Figure 4:
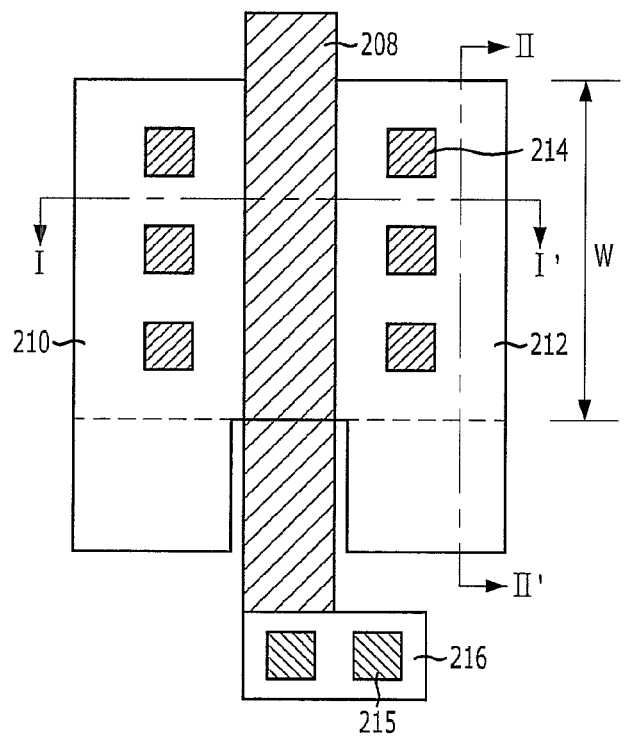
FIG. 4 is a plan view illustrating a semiconductor device in accordance with a first embodiment of the present invention.
Figure 4:
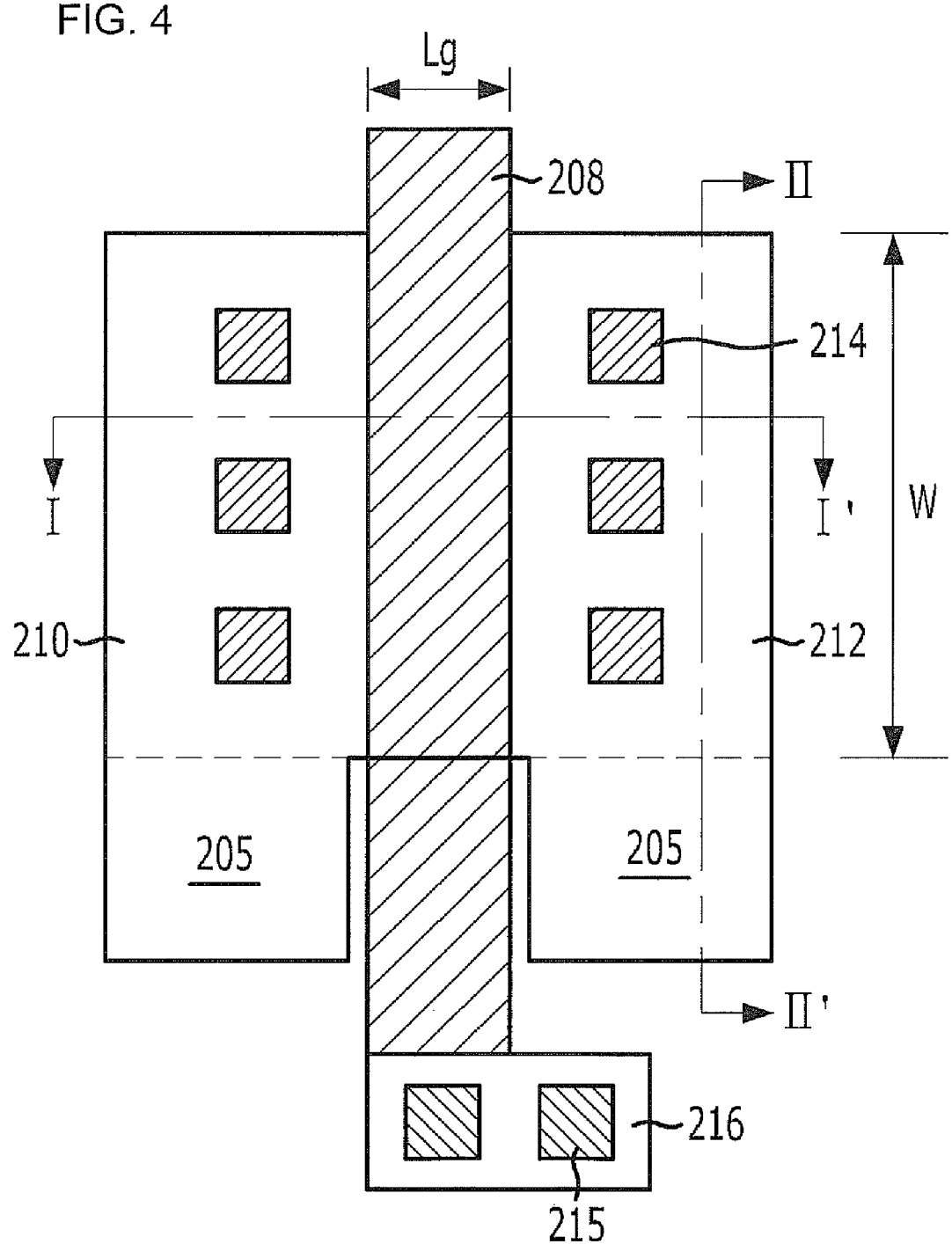
Figure 5:
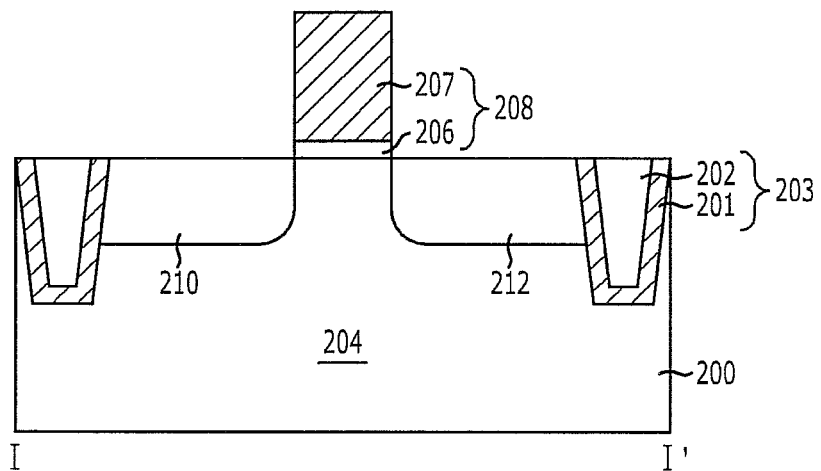
FIG. 5 is a cross-sectional view taken along the line I-I' of FIG. 4.
Figure 6:
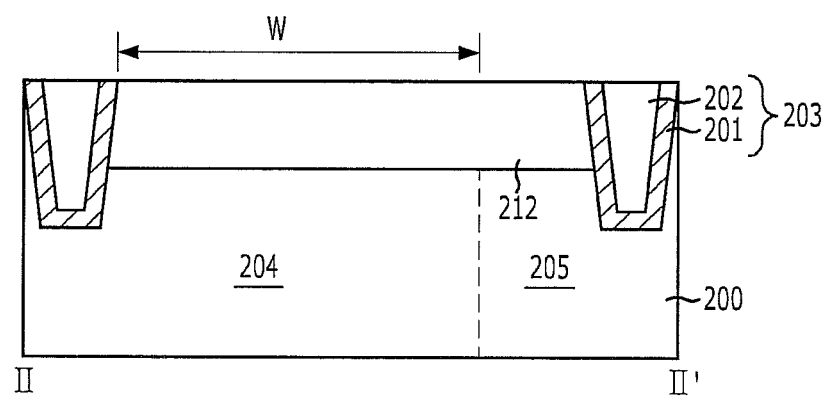
FIG. 6 is a cross-sectional view taken along the line II-II' of FIG. 4.

FIG. 4 is a plan view illustrating a semiconductor device in accordance with a first embodiment of the present invention, and FIGS. 5 and 6 are cross-sectional views taken along the lines I-I' and II-II' of FIG. 4.

Referring to FIGS. 4 through 6, a semiconductor device in accordance with a first embodiment of the present invention includes an isolation structure 203, which is formed in a substrate 200 and delimits an active region 204 and dummy regions 205, which are formed between the active region 204 and the isolation structure 203. The isolation structure 203 includes a multi-layered insulation structure including an oxide layer 201 and a nitride layer 202. The semiconductor device further includes a source 210, which is formed in the active region 204, and one dummy region 205, a drain 212, which is formed in the active region 204, and the other dummy region 205 to be separated from the source 210, and a gate 208, which is formed over the active region 204 to traverse the area between the source 210 and the drain 212. Here, the gate 208 includes a gate dielectric layer 206 and a gate electrode 207.

The active region 204 and the dummy regions 205 are realized using substantially the same manufacturing process and have substantially the same internal structure. For example, a well (not shown), the source 210 and the drain 212 are formed in the active region 204 and the dummy regions 205 through an ion implantation process. However, since forming positions are different, different doping concentrations may be obtained by the manufacturing process. The dummy regions 205 integrally extend from the active region 204 (for example, form a unitary structure). In consideration of the degree of integration of the semiconductor device, the dummy regions 205 are formed so that their entire area is less than the area of the active region 204.

In this way, since the dummy regions 205 are realized through the same manufacturing process that is used for forming the active region 204 and are not physically separated from the active region 204, the dummy regions 205 can be regarded as constituting portions of the active region 204. Nevertheless, the dummy regions 205 must be controlled in such a way as not to be involved in the operation of the semiconductor device, unlike the active region 204, so that the dummy regions 205 do not exert influence on the operation of the semiconductor device. In other words, the region to be involved in the operation of the semiconductor device is limited to the active region 204, and the dummy regions 205 should be controlled not to exert influence on the operation of the semiconductor device.

To this end, the active region 204 is formed to overlap with the gate 208 so that a channel area is defined therein, and the dummy regions 205 are formed not to overlap with the gate 208 so that channel areas are not formed therein. Also, via contacts 214 for respectively connecting the source 210 and the drain 212 with upper metal lines are formed to overlap with the active region 204 and not to overlap with the dummy regions 205. Due to this fact, current flows through the via contacts 214 only in the active region 204. That is to say, current does not flow in the dummy region 205 and flows only in the active region 204 so that the width of a transistor influencing the operation of the semiconductor device can be defined as the width W of the active region 204.

Accordingly, the saturation current of the semiconductor device, that is, the transistor, according to the embodiment of the present invention can be secured at the same level as the saturation current that is obtained by the conventional transistor shown in FIG. 1. In other words, because the width W of the conventional transistor shown in FIG. 1 is substantially the same as the width W of the active region 204 of the transistor according to the embodiment of the present invention shown in FIG. 4, saturation current having the same level as the conventional art can be secured.

Moreover, in the embodiment of the present invention, as the dummy regions 205 are formed between the active region 204 and the isolation structure 203 and extend from the active region 204, the active region 204 can be protected from the mechanical stress applied by the isolation structure 203. While there are various views regarding a precise mechanism by which defects are produced in the source 210 and the drain 212 that are formed to adjoin the isolation structure 203 due to the mechanical stress of the isolation structure 203, the result obtained by the application of the mechanical stress is that the threshold voltage of the transistor changes.

While different results can be obtained depending upon a manufacturing process and a structure, it is the norm that a threshold voltage increases in the case of a PMOS device and decreases in the case of an NMOS device due to the mechanical stress of the isolation structure 203. That is to say, off-state leakage current increases in the case of the PMOS device and decreases in the case of the NMOS device. Furthermore, by NWE, a threshold voltage increases as the width of a transistor decreases, whereas, by RNWE, a threshold voltage decreases as the width of a transistor decreases.

Hence, in the present invention, the dummy regions 205 are formed between the active region 204 and the isolation structure 203 using the same manufacturing process that is used for forming the active region 204 so that the area of an entire active part is increased compared to the conventional art shown in FIG. 1. In consequence, by the presence of the dummy regions 205, it is possible to prevent the mechanical stress of the isolation structure 203 from being transferred to the active region 204 and defects from being produced in various forms in the active region 204. This is advantageous in that, as the threshold voltage of the transistor is increased, off-state leakage current can be reduced.

The semiconductor device according to the present invention further includes via contacts 215, which connect the gate 208 and an upper metal line 216. It is preferred that the via contacts 215 be formed away from the active region 204 as much as possible. To this end, the via contacts 215 are formed to be connected with an end of the gate 208 extending in a direction in which the dummy regions 205 project such that the via contacts 215 do not overlap with the active region 204. In this way, since the via contacts 215 are formed not to overlap with and to be distant from the active region 204, which influences the characteristics of the transistor, it is possible to suppress the electric fields created by the current flowing through the via contacts 215 from being concentrated on the peripheral portions of the active region 204, whereby it is possible to prevent the off-state leakage current of the transistor from increasing. As a result, in the embodiment of the present invention, off-state leakage current can be reduced compared to the conventional semiconductor device in which off-state leakage current increases due to the concentration of electric fields.

Figure 3:
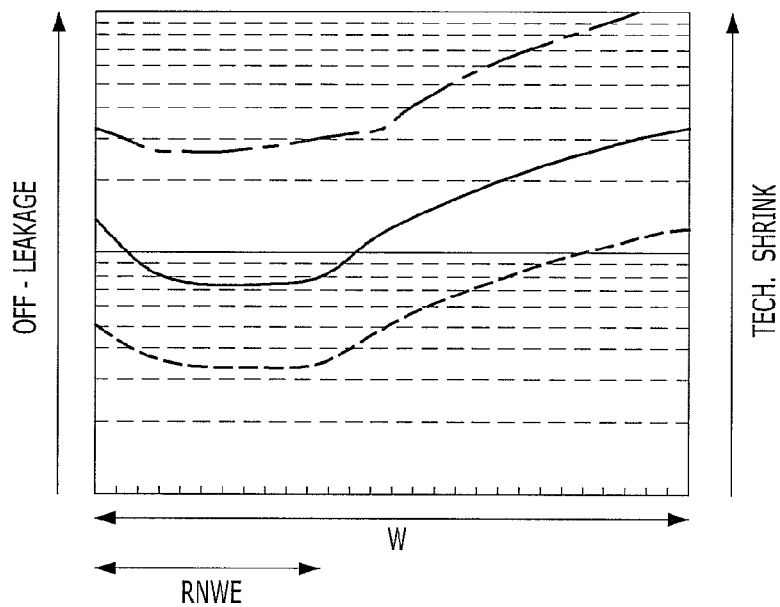
FIG. 3 is a graph showing the characteristics of the conventional semiconductor device.
Figure 7:
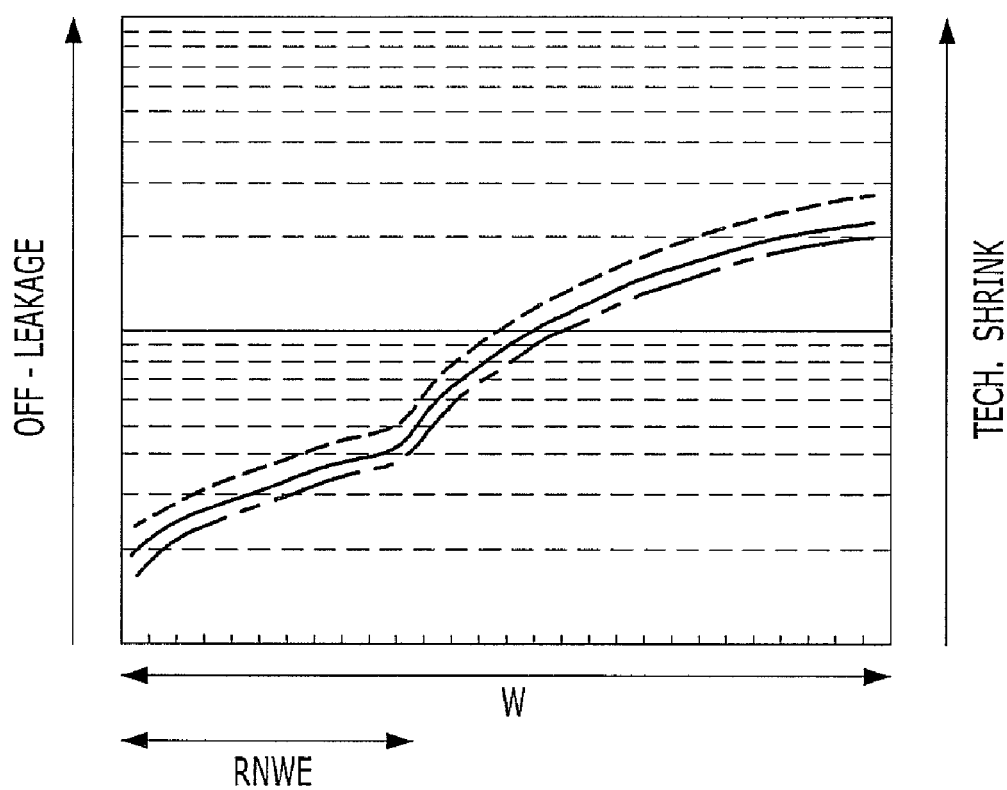
FIG. 7 is a graph showing the characteristics of the semiconductor device according to the present invention.

FIG. 7 is a graph showing the off-state leakage current characteristics of the semiconductor device according to the present invention. The graph shows the relationship between the off-state leakage current and the width of the transistor. When compared to the graph of FIG. 3 showing the off-state leakage current characteristics of the conventional semiconductor device, it can be seen that off-state leakage current decreases as the width of the transistor decreases through an RNWE range.

Various embodiments of the present invention, which will be described below, also include a technique for reducing off-state leakage current by virtue of dummy regions as described in the aforementioned embodiment. The respective embodiments can be differentiated from one another at least in terms of positions where the dummy regions are formed and the structure of the dummy regions.

In the embodiment shown in FIG. 4, the dummy regions 205 are formed to project from one side of the active region 204 in a direction parallel to the gate 208 on the left and right sides of the gate 208. Thus, when viewed in the plan view of FIG. 4, the active region 204 and the dummy regions 205 define the substantial shape of an 'n'.

Figure 8:
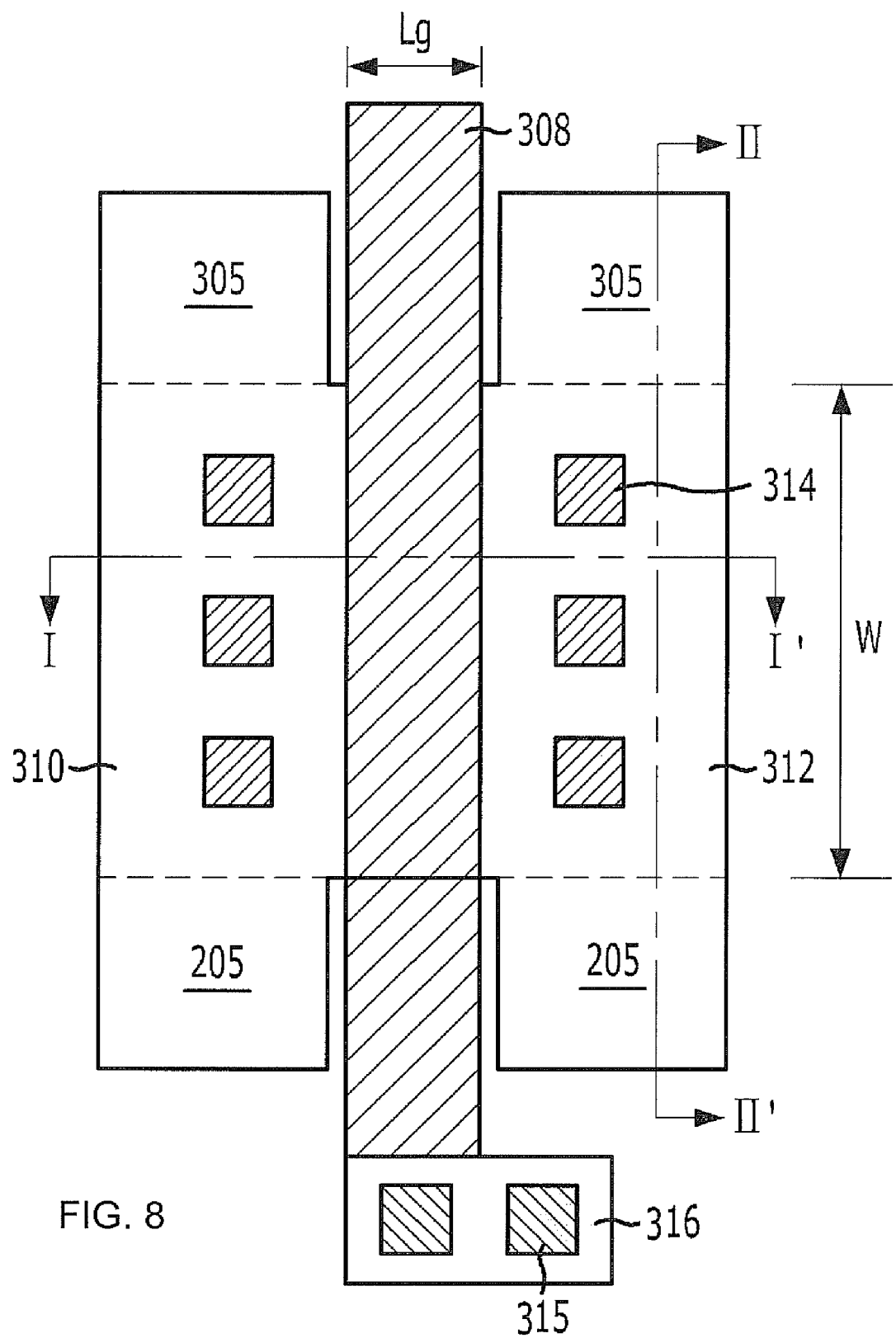
FIG. 8 is a plan view illustrating a semiconductor device in accordance with a second embodiment of the present invention.
Figure 9:
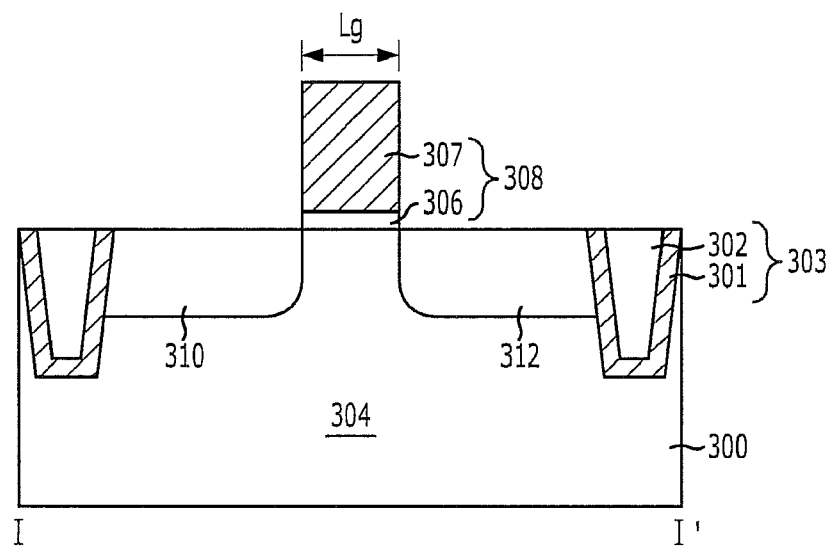
FIG. 9 is a cross-sectional view taken along the line I-I' of FIG. 8.
Figure 10:
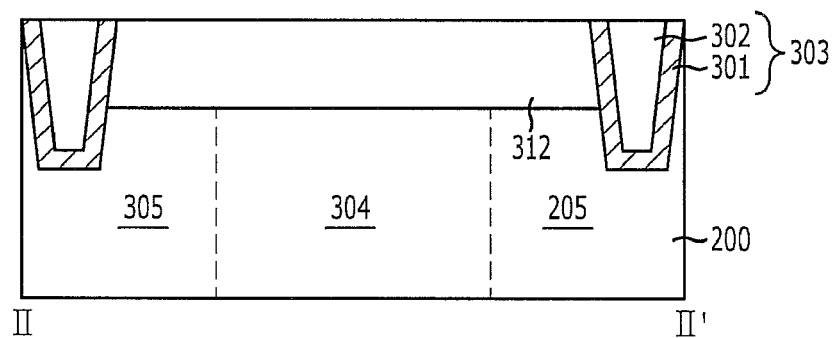
FIG. 10 is a cross-sectional view taken along the line II-II' of FIG. 8.

FIGS. 8 through 10 illustrate a semiconductor device in accordance with a second embodiment of the present invention. FIG. 8 is a plan view and FIG. 9 is a cross-sectional view taken along the line I-I' of FIG. 8. FIG. 10 is a cross-sectional view taken along the line II-II' of FIG. 8.

Referring to FIGS. 8 through 10, as in the aforementioned embodiment, dummy regions 305 are formed between an active region 304 and an isolation structure 303. The isolation structure 303 includes a multi-layered insulation structure including an oxide layer 301 and a nitride layer 302. In the aforementioned embodiment, the dummy regions 205 are formed on the lower side of the active region 204 when viewed in the plan view of FIG. 4. However, in the present embodiment, the dummy regions 305 are formed on both lower and upper sides of the active region 304 when viewed along a direction in which a gate 308 extends. According to this fact, in the present embodiment, when viewed in the plan view of FIG. 8, the active region 304 and the dummy regions 305 define the substantial shape of an 'H'. Because the gate 308, via contacts 314 and 315 and an upper metal line 316 except the dummy regions 305 are formed in the same manner as in the aforementioned embodiment, detailed description thereof will be omitted herein.

Figure 11:
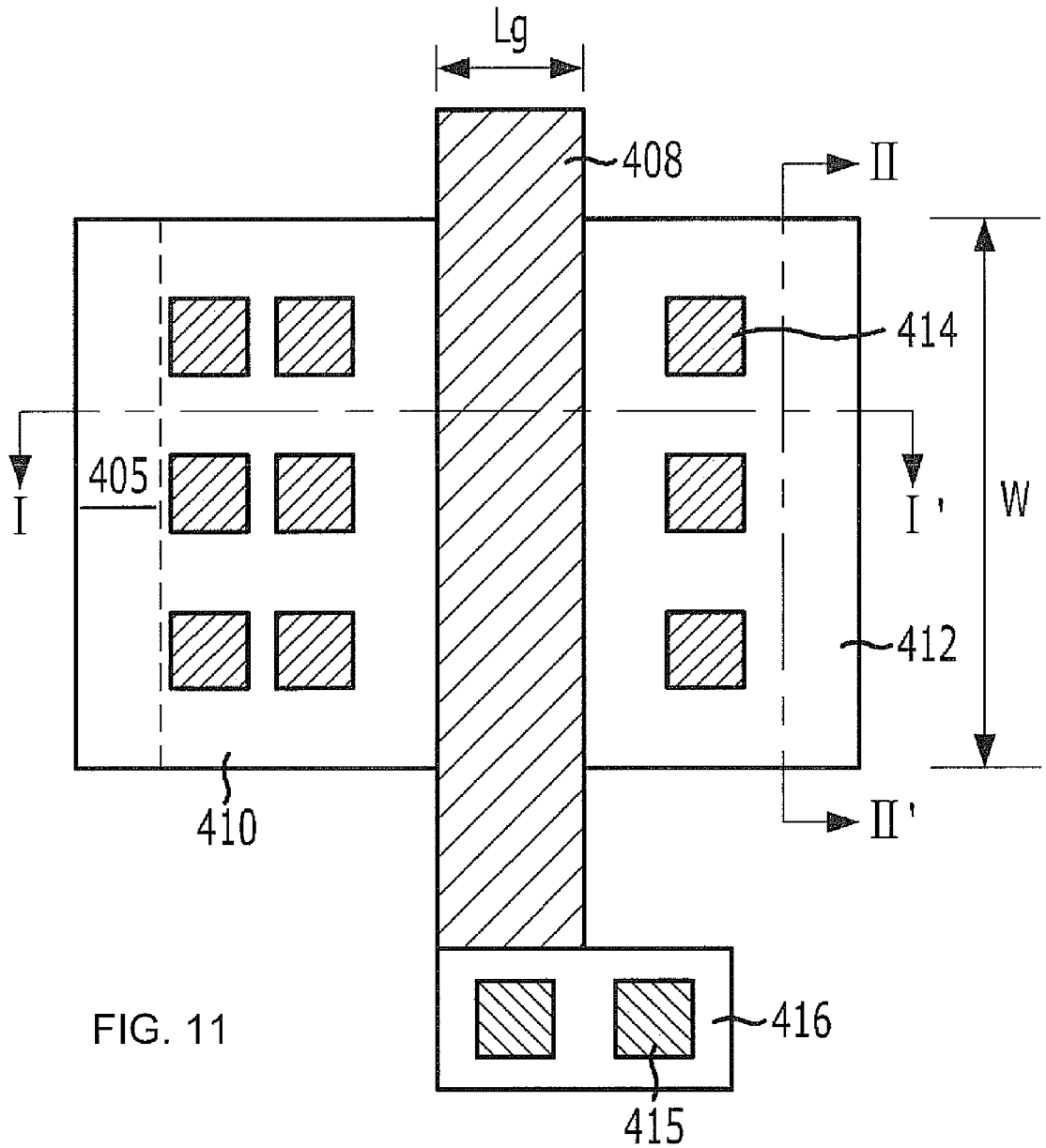
FIG. 11 is a plan view illustrating a semiconductor device in accordance with a third embodiment of the present invention.
Figure 11:
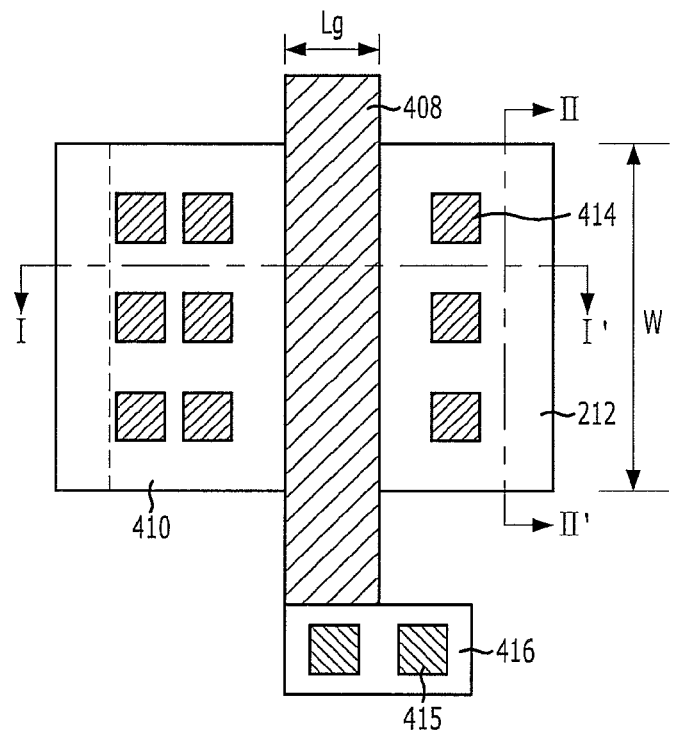
Figure 12:
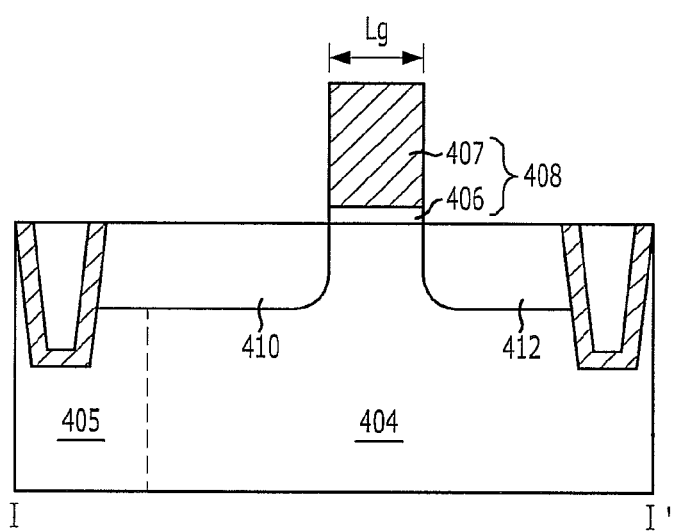
FIG. 12 is a cross-sectional view taken along the line I-I' of FIG. 11.
Figure 13:
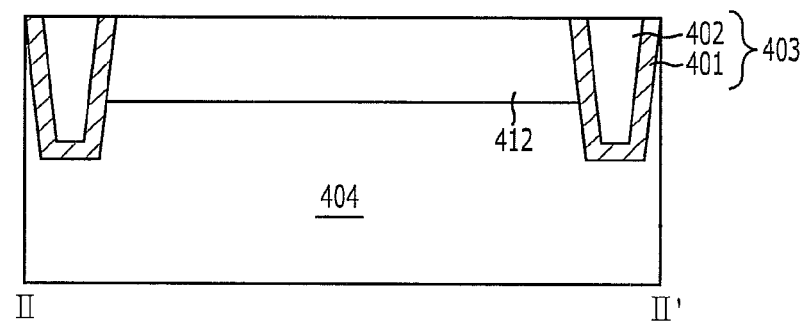
FIG. 13 is a cross-sectional view taken along the line II-II' of FIG. 11.

FIGS. 11 through 13 illustrate a semiconductor device in accordance with a third embodiment of the present invention. FIG. 11 is a plan view and FIG. 12 is a cross-sectional view taken along the line I-I' of FIG. 11. FIG. 13 is a cross-sectional view taken along the line II-II' of FIG. 11.

Referring to FIGS. 11 through 13, unlike the aforementioned embodiments in which dummy regions are formed on the upper side and/or lower side of the active region when viewed in a plan view, in the present embodiment, a dummy region 405 is formed integrally with the left side of an active region 404 on the left side of a gate 408 (where a source 410 is formed). Here, the gate 408 includes a gate dielectric layer 406 and a gate electrode 407. Due to this fact, the source 410 and a drain 412 are formed to have asymmetric structures. In other words, the source 410 is formed to have an area larger than the drain 412. Of course, it is conceivable that the dummy region 405 is formed integrally with the right side of the active region 404 on the right side of the gate 408 so that the drain 412 has an area larger than the source 410. Because the gate 408, via contacts 414 and 415 and an upper metal line 416 except the dummy region 405 are formed in the same manner as in the aforementioned embodiments, detailed description thereof will be omitted herein.

Figure 14:
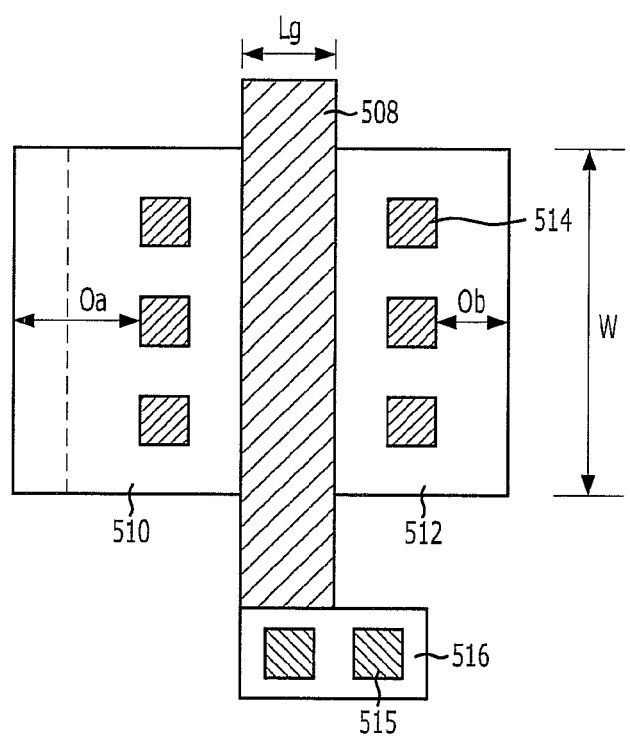
FIG. 14 is a plan view illustrating a semiconductor device in accordance with a fourth embodiment of the present invention.

FIG. 14 is a plan view illustrating a semiconductor device in accordance with a fourth embodiment of the present invention.

Referring to FIG. 14, in the present embodiment, the structure of the semiconductor device is the same as in the embodiment shown in FIG. 11 except the number of via contacts 514. In FIG. 11, the number of the via contacts 414, which are connected with the source 410, is increased in correspondence to the additional formation of the dummy region 405. Namely, the number of the via contacts 414, which are connected with the source 410, is increased to be greater than the number of the via contacts 414, which are connected with the drain 412. However, in the present embodiment shown in FIG. 14, while a source 510 is formed to have an area larger than a drain 512 in the same manner as in the embodiment shown in FIG. 11, the number of the via contacts 514 is set to be the same on the source 510 and the drain 512 irrespective of the difference in the areas thereof. Accordingly, the distance Oa measured from the left side of the source 510 to the left ends of the via contacts 514, which are present on the source 510 can be the same as or different from the distance Ob measured from the right side of the drain 512 to the right ends of the via contacts 514, which are present on the drain 512. Because a gate 508, via contacts 515, which are connected with the gate 508, and an upper metal line 516 except the via contacts 514 are formed in the same manner as in the aforementioned embodiments, detailed description thereof will be omitted herein.

The active regions and the dummy regions mentioned in the aforementioned embodiments are not limited to the illustrated quadrangular structures, and for example, polygonal structures including triangular, pentagonal and octagonal structures and circular structures including an elliptical structure can be adopted without departing from the technical concept of the present invention. Furthermore, the gate is not limited to the bar type, and a comb-shaped structure having at least two teeth can be adopted.

The present invention described above provides advantages as described below.

First, in the present invention, a dummy region is formed between an active region and an isolation structure using the same manufacturing process that is used for forming the active region, and through this, the area of the active region can be increased compared to the conventional art. Therefore, by the presence of the dummy region, it is possible to prevent defects of diverse forms from being produced in the active region due to the mechanical stress of the isolation structure. Consequently, as the threshold voltage of a transistor is increased, off-state leakage current can be reduced.

Second, in the present invention, via contacts, which connect a gate with an upper metal line, are formed in such a way as to be separated from the active region. Through this, it is possible to prevent the electric fields created by the current flowing through the via contacts from being concentrated on the peripheral portions of the active region. As a consequence, off-state leakage current can be reduced compared to the conventional semiconductor device in which off-state leakage current increases due to the concentration of electric fields.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   an active region formed in a substrate;
   a gate formed over the active region;
   one or more dummy regions that are formed one or more opposite sides of the gate while not overlapping with the gate and are extended integrally from the active region;
   an isolation structure formed to surround the active region and the dummy regions;
   a source and a drain formed in the active region; and
   one or more via contacts connected with the source and the drain formed on the active region,
   wherein the via contacts are formed such that the number of via contacts, which are connected with the source, and the number of via contacts, which are connected with the drain, are the same as or different from each other depending upon the areas of the source and the drain.

2. The semiconductor device of claim 1, wherein the source and the drain are formed to have asymmetric or symmetric structures with respect to the gate.

3. The semiconductor device of claim 1, wherein the source is formed to have an area that is larger or smaller than the drain.

4. The semiconductor device of claim 1, wherein the source is formed to have the same area as the drain.

5. The semiconductor device of claim 1, further comprising:
   a channel area formed in the active region under the gate.

6. The semiconductor device of claim 1, wherein the via contacts are not connected with the one or more dummy regions.

7. The semiconductor device of claim 1, wherein a larger number of via contacts are connected with one of the source or the drain, wherein said one of the source or the drain has a larger area than the other one.

8. The semiconductor device of claim 1, wherein the via contacts are formed such that a distance measured from an outer end of the source to outer ends of the via contacts present over the source and a distance measured from an outer end of the drain to outer ends of the via contacts present over the drain are the same as or different from each other depending upon the respective areas of the source and the drain.

9. The semiconductor device of claim 1, wherein the active region and the one or more dummy regions are formed to have a polygonal or circular structure.

10. The semiconductor device of claim 1, wherein the active region and the one or more dummy regions define substantially the shape of a small-cap English letter 'n' or a large-cap English letter 'H'.

11. The semiconductor device of claim 1, further comprising:
   via contacts connecting an end of the gate with an upper metal line.

12. The semiconductor device of claim 11, wherein the via contacts are formed to be separated from the active region.

* * * * *